United States Patent
Alavi et al.

(10) Patent No.: US 8,965,317 B2
(45) Date of Patent: Feb. 24, 2015

(54) RF AGC CONTROL

(75) Inventors: Reza Alavi, Belle Mead, NJ (US); Saeed Aghtar, Hillsborough, NJ (US); Christoph Steinbrecher, Somerset, NJ (US); Arathi Sundaresan, Jersey City, NJ (US)

(73) Assignee: Analog Devices, Inc., Norwood, MA (US)

( * ) Notice: Subject to any disclaimer, the term of this patent is extended or adjusted under 35 U.S.C. 154(b) by 189 days.

(21) Appl. No.: 13/094,485

(22) Filed: Apr. 26, 2011

(65) Prior Publication Data

US 2012/0274398 A1 Nov. 1, 2012

(51) Int. Cl.
 H04B 1/06 (2006.01)
 H03F 3/189 (2006.01)
 H03F 3/45 (2006.01)
 H03G 1/00 (2006.01)
 H03G 3/30 (2006.01)

(52) U.S. Cl.
 CPC ............ *H03F 3/189* (2013.01); *H03F 3/45475* (2013.01); *H03F 3/45932* (2013.01); *H03G 1/0029* (2013.01); *H03G 1/007* (2013.01); *H03G 1/0088* (2013.01); *H03G 3/3052* (2013.01); *H03F 2200/294* (2013.01)
 USPC ................... 455/234.1; 455/234.2; 455/239.1; 455/240.1; 455/241.1; 455/247.1; 455/251.1

(58) Field of Classification Search
 USPC .......... 455/226.1–226.4, 232.1, 234.1, 234.2, 455/239.1, 240.1, 241.1, 245.1, 247.1, 455/250.1, 251.1, 253.1
 See application file for complete search history.

(56) References Cited

U.S. PATENT DOCUMENTS

| | | | |
|---|---|---|---|
| 5,838,194 A | 11/1998 | Khoury | |
| 6,134,430 A * | 10/2000 | Younis et al. | 455/340 |
| 6,498,926 B1 * | 12/2002 | Ciccarelli et al. | 455/240.1 |
| 7,187,915 B2 | 3/2007 | Wang et al. | |
| 7,515,891 B2 * | 4/2009 | Darabi | 455/250.1 |
| 7,676,206 B2 | 3/2010 | Ragan et al. | |
| 7,933,361 B2 * | 4/2011 | Huang et al. | 375/316 |
| 8,045,941 B2 * | 10/2011 | Muhammad et al. | 455/232.1 |
| 2003/0054787 A1 * | 3/2003 | Behzad et al. | 455/234.1 |
| 2004/0259511 A1 | 12/2004 | Liu et al. | |
| 2006/0222118 A1 | 10/2006 | Murthy et al. | |
| 2007/0224960 A1 * | 9/2007 | Sekiguchi et al. | 455/245.1 |
| 2008/0114252 A1 | 5/2008 | Randall et al. | |
| 2009/0088112 A1 * | 4/2009 | Nonin | 455/234.1 |
| 2009/0227222 A1 * | 9/2009 | Lu et al. | 455/234.1 |
| 2009/0264090 A1 * | 10/2009 | Ivonnet et al. | 455/233.1 |
| 2010/0022211 A1 * | 1/2010 | Huang | 455/232.1 |

OTHER PUBLICATIONS

International Search Report and Written Opinion of the International Searching Authority in counterpart International Application No. PCT/US2012/035148, report dated Aug. 6, 2012.

* cited by examiner

*Primary Examiner* — Junpeng Chen
(74) *Attorney, Agent, or Firm* — Kenyon & Kenyon, LLP

(57) ABSTRACT

Embodiments of the present invention may provide a signal processor with a wide gain range. The signal processor may comprise at least a discrete step gain stage and a continuous variable gain amplifier (VGA) stage. The discrete step gain stage may comprise a programmable gain amplifier (PGA) (e.g., low noise amplifiers 1 and 2 (LNA1 and LNA2)). The VGA stage may provide a continuous range to compensate the LNAs gain steps. In one embodiment, the AGC controller enables an inherent hysteresis with the AGC step change if required.

21 Claims, 11 Drawing Sheets

RF AGC CONTROL

FIELD OF INVENTION

The present invention relates to signal processors, and more particularly to a signal receiver that provides a wide range of continuous front end gain.

BACKGROUND

Signal processors sometimes incorporate a front-end gain stage to keep an input signal within the input range of an analog-to-digital converter (ADC). For example, FIG. 1 shows a prior art receiver with a front-end gat stage before an ADC. Sometimes, the front-end system contains a mixer to bring the input signals to a frequency band that can be digitized by the ADC.

In a typical application, a gain control algorithm changes the front-end gain according to the signal power at the input or output of the ADC. The specific usage of the signals determines whether the front-end gain changes should be continuous or discrete. A lot of applications require continuous signals and often cannot tolerate jumps in the front-end gain due to large gain steps. However, it is extremely challenging to provide continuous gain variation with a wide gain range and sufficient linearity. Further, continuous gain is difficult to implement in semiconductor processes and special processes are usually required to design such gain stages. For example, complementary metal-oxide-semiconductor (CMOS) technology can only provide gains in steps and thus, is not well suited to implement gain stage with a continuous gain variation. Therefore, there is a need in the art for providing a signal processor that can provide a wide range of continuous front end gain.

DETAILED DESCRIPTION

Embodiments of the present invention may provide a signal processor with a wide gain range. The signal processor may comprise at least a discrete step gain stage and a continuous variable gain amplifier (VGA) stage. The discrete step gain stage may comprise a programmable gain amplifier (PGA) (e.g., low noise amplifiers 1 and 2 (LNA1 and LNA2)). The VGA stage may provide a continuous range to compensate the LNAs gain steps. In one embodiment, the AGC controller enables an inherent hysteresis with the AGC step change if required.

Furthermore, the present invention may also provide for a method of calibrating and controlling a signal processing AGC with non-uniform gain steps. The method may comprise measuring offsets of the gain steps with respect to a lowest gain and record the offsets. When the step gain changes, the AGC may provide a continuous gain by looking up the offset and compensate for the offset.

Figure 1:
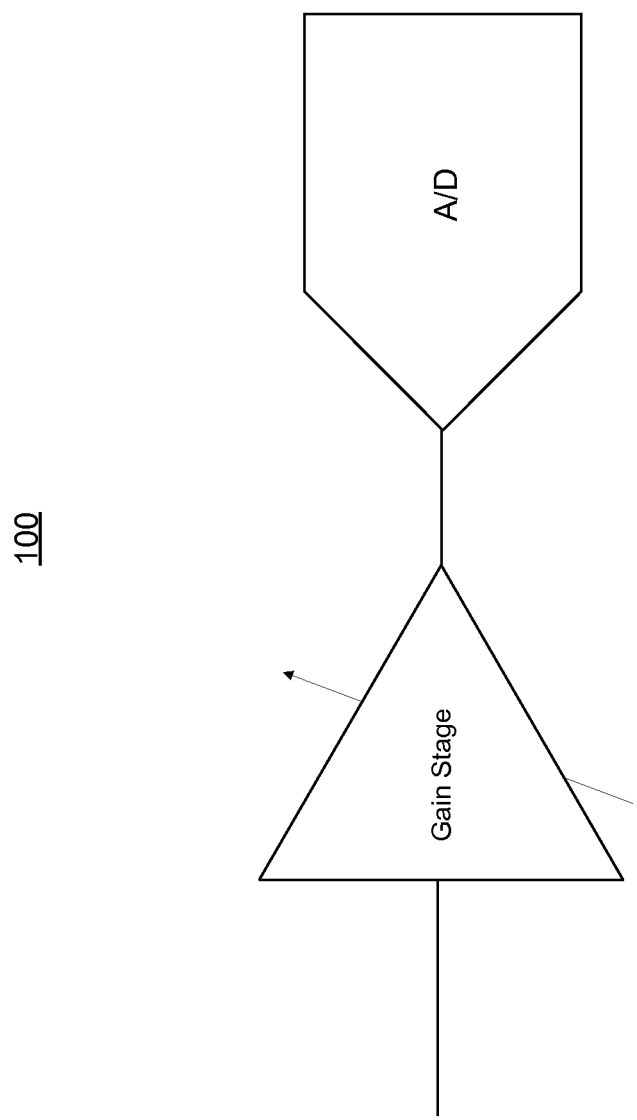
FIG. 1 illustrates a prior art receiver with a front gain stage.
Figure 2:
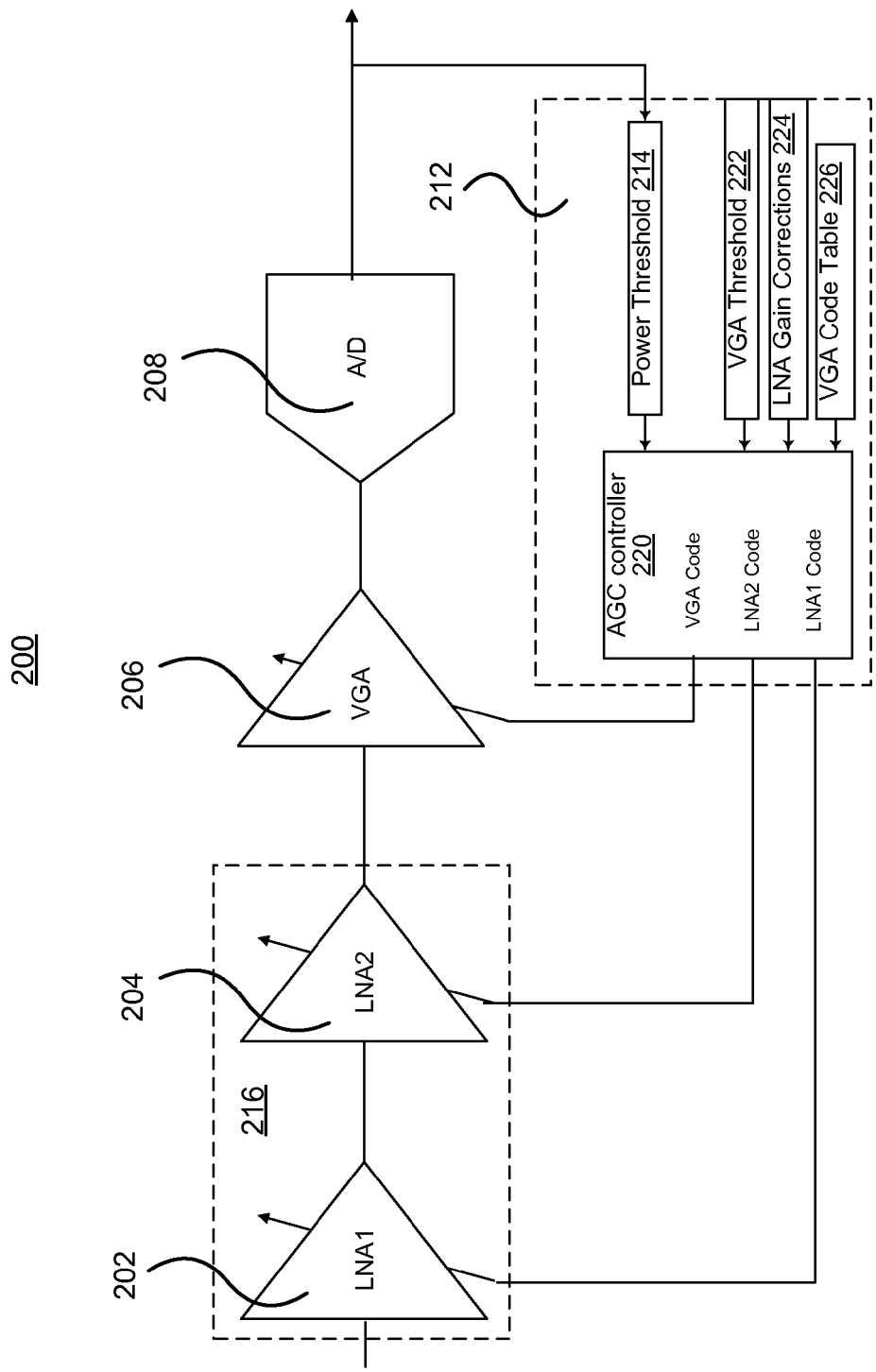
FIG. 2 illustrates a signal processor with a wide range of continuous front end gain according to an exemplary embodiment of the present invention.

FIG. 2 illustrates a signal processor 200 according to an exemplary embodiment of the present invention. The signal processor 200 may comprise a discreet gain stage 216, a continuous gain stage 206 (e.g., variable gain amplifier (VGA)), an analog-to-digital converter (ADC) 208, an automatic gain control (AGC) block 212. The discreet gain stage 216 may comprise discreet step amplifiers LNA1 202 and LNA2 204. The two discreet step amplifiers LNA1 and LNA2 may be collectively referred to as the PGA. The overall front end gain to the ADC 208 may be provided by the combination of LNA1, LNA2 and VGA 206. Each of the LNA1 and LNA2 may provide stepwise gains and the VGA 206 may provide continuous gain to supplement the steps (e.g., continuous gain between the steps). Thus, the overall front end gain may be a wide range of continuous gain. This overall front end gain may be controlled by an AGC algorithm and referred to as the AGC gain. The AGC gain may be determined and controlled by the AGC block 212, which may comprise a power threshold block 214, an AGC controller 220, a VGA threshold 222, LNA gain corrections 224 and a VGA code table 226.

In one embodiment, the AGC gain may set based on the root mean square (RMS) power of the ADC output (e.g., output of the ADC 208) with respect to a target value. The AGC block 212 may monitor the input signal strength by comparing the ADC output to a power threshold at the power threshold block 214. If ADC output power is below a lower power threshold, the AGC gain may be increased. And if the ADC output power is above an upper power threshold, the AGC gain may be decreased. The AGC block 212 may include one or more filters that performs post processing on the control decisions to smooth out decision outputs and to control the adaptation rate (e.g., adjust the gain slowly even when the input signal power level needs to be greatly changed). Further, the AGC block 212 may control the timing of when the control signal is applied relative to system timing. The filtered output of the AGC decisions may be referred to as the control signal.

The power threshold block 214 may signify a change in the overall front end gain by changing an AGC control signal. The AGC controller 220 may map the AGC control signal received from the power threshold block 214 to an AGC control code. The AGC control code may be a specific code combination of the VGA code, LNA1 code and LNA2 code. The specific code combination may correspond a collective settings for the VGA, LNA1 and LNA2 to achieve the target overall front end gain. The respective VGA code, LNA1 code and LNA2 code may be determined using the VGA threshold 222, LNA Gain Corrections 224 and VGA code table 226.

The VGA threshold 222 may store programmable upper and lower VGA threshold levels. These upper and lower VGA threshold levels may be used to determine whether the gain change warrants a step change. That is, when the continuous change provided by the VGA 206 may be increased or decreased to the level of a step of the LNA1 or LNA2, this amount of gain may be provided by the LNA1 or LNA2, and the gain provided by the VGA 206 may be reduced accordingly.

The LNA Gain Corrections 224 may be used to correct system errors of step gains. For example, the LNA gain steps may be non-uniform (e.g., a step of 3 dB may be actually 2.99 dB or 3.01 dB instead of an exact 3 dB). System errors of each gain step, which may be referred to as LNA offsets, may be recorded during a calibration process (to be described in detail later) and recorded. The LNA Gain Corrections 224 may store the LNA offsets. The AGC controller 220 may use the LNA offsets to determine the exact LNA gain and compensate with the VGA gain to ensure a smooth step change. The VGA code table 226 may store a plurality of VGA codes mapped to respective gain levels (e.g., smallest unit level controlled by the VGA). The VGA code and mapping will be described later.

In one embodiment, the signal processor 200 may be a broadband front-end receiver and the AGC block 212 may be implemented as a radio frequency (RF) AGC. In one embodiment, the broadband front-end receiver 200 may operate on an input signal having at most a Nyquist bandwidth (BW). For example, the signal processor 200 may operate on input signals up to 1 GHz of BW to accommodate the international telecommunications standard Data Over Cable Service Interface Specification (DOCSIS) cable signaling requirements.

Figure 3:
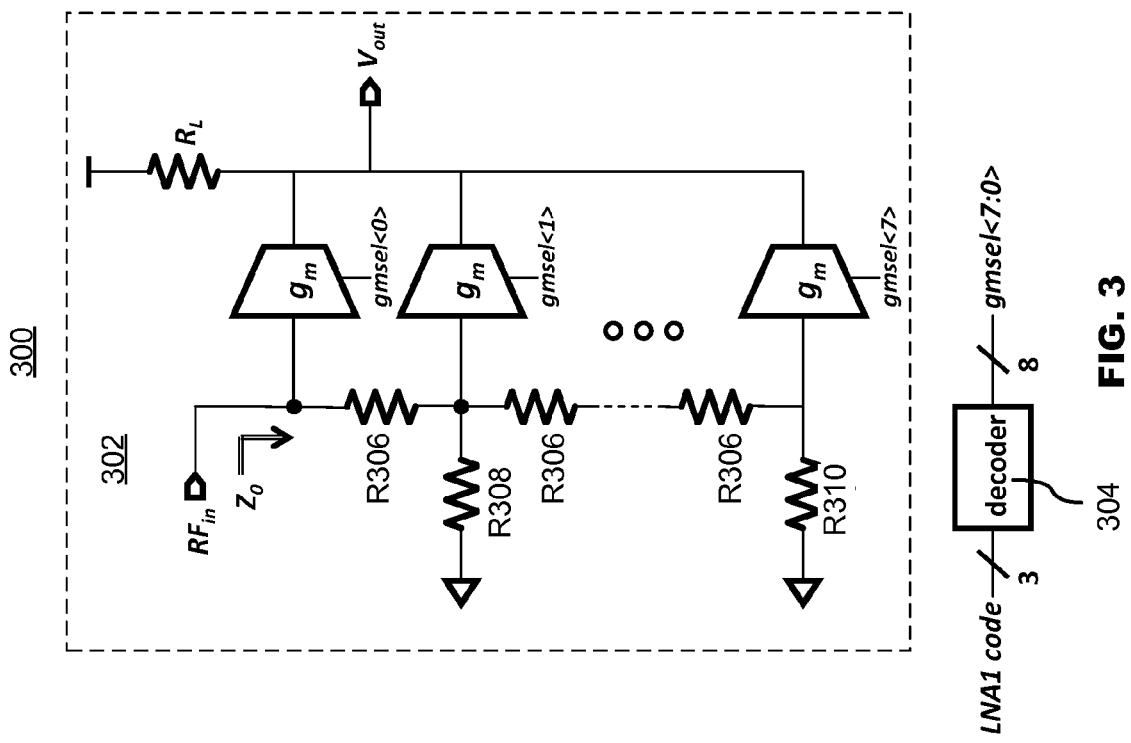
FIG. 3 illustrates a low noise amplifier according to an exemplary embodiment of the present invention.

The signal processor 200 may provide a wide gain range with discrete step gain stages using LNA1 and LNA2. FIG. 3 illustrates a low noise amplifier (LNA) 300 according to an embodiment of the present invention. The LNA 300 may comprise a ladder network 302 and a decoder 304. The ladder network 302 may comprise a plurality of resistors R306 chained in series with parallel resistors (e.g., shunt resistors) R308 coupled to each intermediate ladder node and a resistor R310 coupled to the bottom ladder node. The signal amplitude of a particular ladder node may be attenuated by a certain amount (e.g., a step) with respect to the previous ladder node. The tap-to-tap attenuation may be set by the values of the resistors R306, R308, and R310. In one embodiment, each ladder node may be coupled to a switchable transconductance amplifier (e.g., a gm-stage). The decoder 304 may generate a control signal (e.g., one of the control signals gmsel<7:0> may be on and others may be off) (the shorthand notion <n:0> in the specification may refer to the series 0, 1, 2, . . . n) to select a particular gm-stage. The output current of the gm-stages may flow into a load resistor RL to generate the output voltage.

In one embodiment, the ladder network 302 may comprise eight (8) ladder nodes (e.g., 8 gm-stages) with each of the eight gm-stages being individually switchable. In this embodiment, the LNA code may be a three bits code and the decoder 304 may map the code to a control signal to activate one of the eight gm-stages. The gain step change in the LNAs may be have a particular nominal value (e.g., 3 dB steps). In this embodiment, only one gm-stage may be active at any time and the 8 nodes resistor ladder may result in a gain range of 7 times the particular nominal value (e.g., 21 dB).

The resistive input ladder network 302 may achieve constant Signal to Noise-plus-Distortion Ratio (SNDR) performance over a wide range of input amplitudes. In addition, the frequency response variation from one ladder node to the next may be small, resulting in a frequency-independent gain-control that progressively attenuates the input signal.

Figure 4:
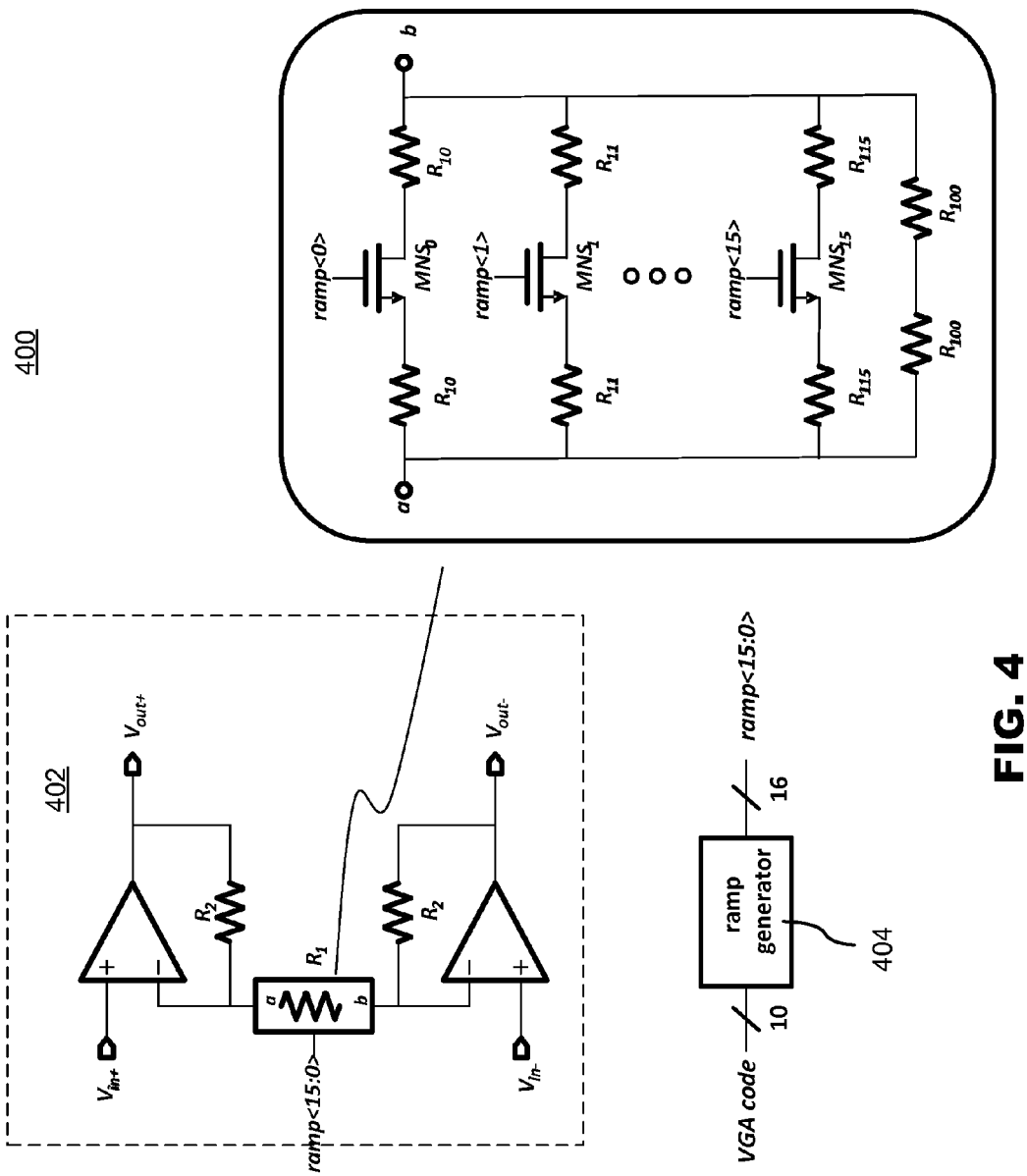
FIG. 4 illustrates a continuous variable gain amplifier (VGA) according to an exemplary embodiment of the present invention.

In the signal processor 300, the VGA gain provided by the VGA stage 206 may compensates the LNAs step gain changes in order to provide a continuous variable gain from a system perspective. FIG. 4 illustrates a VGA 400 according to an embodiment of the present invention. The VGA 400 may comprise a feedback amplifier 402 and a ramp generator 404. In one embodiment, the VGA may achieve a continuous gain by changing the value of the input-side resistor R1 of the feedback amplifier 402. R1 may include a plurality of switchable resistors. The plurality of switchable resistors may be controlled by ramps. That is, they may be controlled by soft switches (e.g., switches may be operating in weak inversion (or moderate inversion) regions (e.g., not fully open (strong inversion) or completely closed (sub-threshold) but in a kind of intermediate (leaking) mode)). The ramps may be generated by the ramp generator 404. In one embodiment, the feedback amplifier 402 may be a non-inverting feedback amplifier. In another embodiment, an inverting feedback amplifier could be used as well.

In one embodiment, as shown in FIG. 4, the input-side resistor R1 may comprise a bank of 16 switchable resistors, each controlled by one of the switches $MNS_0$ to $MNS_{15}$. The switches $MNS_0$ to $MNS_{15}$ may be controlled by the ramps ramp<0>~ramp <15>, respectively. Each of the switches $MNS_0$ to $MNS_{15}$ may operate in the weak inversion regions. The values of R10, R11, . . . , R115 may be chosen such that the closed-loop gain of the amplifier has a linear-in-dB characteristic. In one embodiment, the non-inverting feedback amplifier 402 may be a current-feedback amplifier (CFA). Therefore, gain-independent loop gain may be achieved. Although the VGA only needs to provide enough continuous range to compensate for maximum LNA steps change, a VGA gain range larger than the LNA step may allow for incorporating hysteresis in the AGC path. In one embodiment, the VGA gain range may be 10 dB while the LNA step may be 3 dB.

Figure 5:
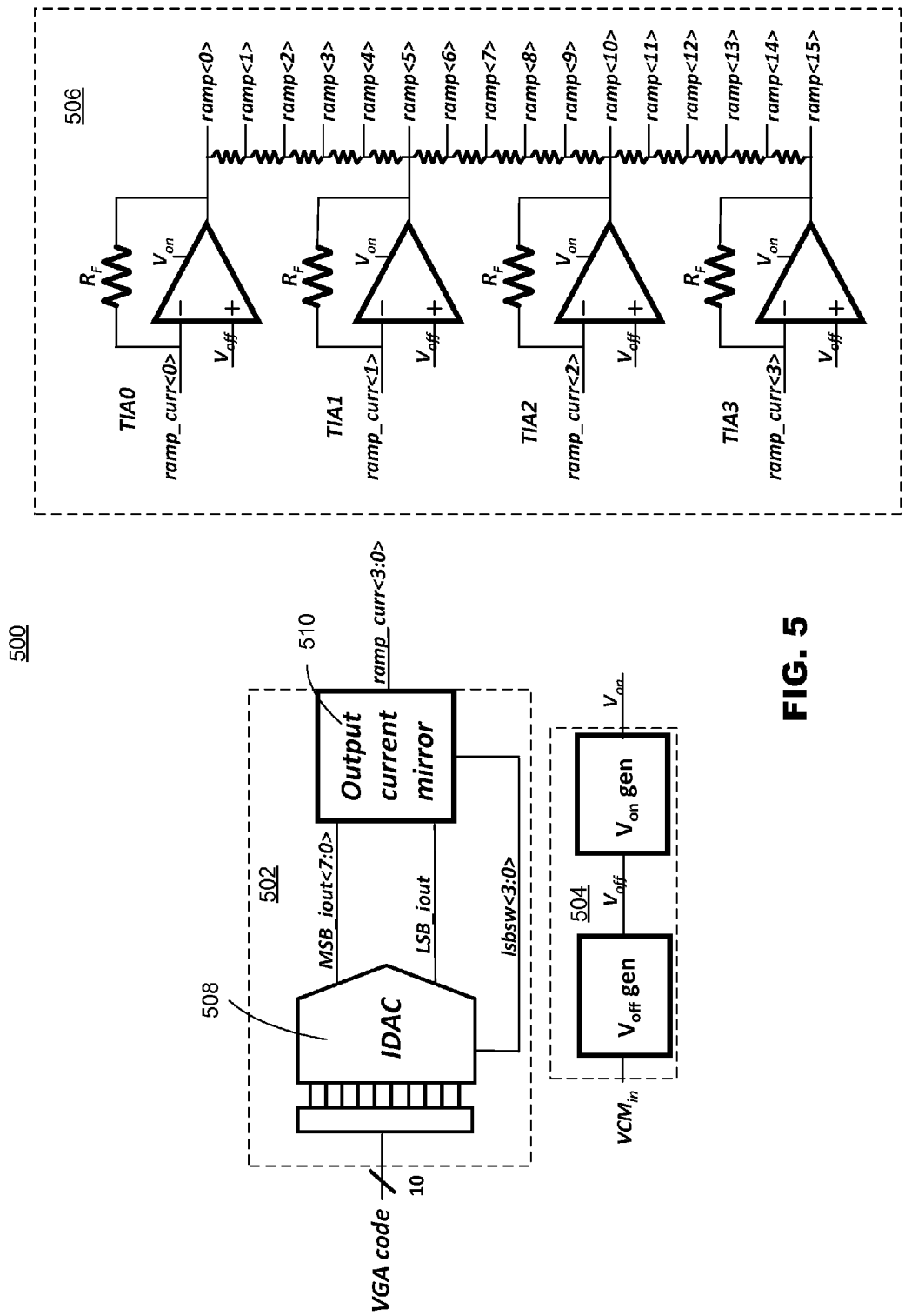
FIG. 5 illustrates VGA control signal mapping according to an exemplary embodiment of the present invention.

In one embodiment, the VGA code may be a 10-bit control word applied to the VGA 206. The ramp generator 404 may map the 10 bit word to 16 ramp levels. FIG. 5 illustrates a ramp generator 500 that maps the VGA code to the VGA setting according to an embodiment of the present invention. The ramp generator 500 may comprise a ramp current generator 502, a control voltage generator 504 and output ramp level generator 506. The ramp current generator 502 may comprise a current digital-to-analog converter (IDAC) 508 and an output current mirror 510. The 10-bit word may be input to the 10-bit IDAC 508. The IDAC 508 may generate an output current for each of the 8 most significant bits (MSB) of the 10-bit word and thus, there are 8 MSB output currents: MSB_iout<7:0>. The IDAC 508 may also generate one output current for the 2 least significant bits of the 10-bit word: LSB_iout (e.g., 4 levels). The 9 output currents (e.g., 8 MSB_iout and 1 LSB_iout) may be applied to the output current mirror 510. The IDAC 508 may further generate a plurality of control signals (e.g., four control signal Isbsw<3:0>) from the VGA code. The output current mirror 510 may combine the 9 output currents to generate four ramp currents ramp_curr<3:0> according to the control signals. The details of the output current mirror 510 will be described with respect to FIG. 6A and the generation of the control signals will be described with respect to FIG. 6B below.

The four ramp currents generated by the output current mirror 510 may be provided to the output ramp level generator 506, which may comprise four trans-impedance amplifiers (TIA), TIA0 through TIA3. The four ramp currents may be applied to the four TIAs respectively to generate ramp voltages ramp<0>, ramp<5>, ramp<10> and ramp<15>. As shown in FIG. 5, the remaining ramp voltages (e.g., ramp<1>, ramp<2>, etc.) may be generated by resistively interpolating the outputs of the four TIAs.

The control voltage generator 504 may comprise two voltage generation blocks: a $V_{off}$-gen block and a $V_{on}$-gen block. The voltage $V_{off}$ may be a function of the input common-mode voltage $VCM_{in}$. The voltage $V_{on}$ may be the maximum voltage that complies with the allowable operating voltages of the switches $MNS_0$ through $MNS_{15}$ in the resistor bank R1 of FIG. 4. The voltage $V_{off}$ may be applied to the positive terminal of the TIAs. The ramp voltages generated by the output ramp level generator 506 may start at a voltage level $V_{off}$, and the maximum voltage of the ramp voltages may be Imax*Rf, but is no larger than $V_{on}$.

Figure 6A:
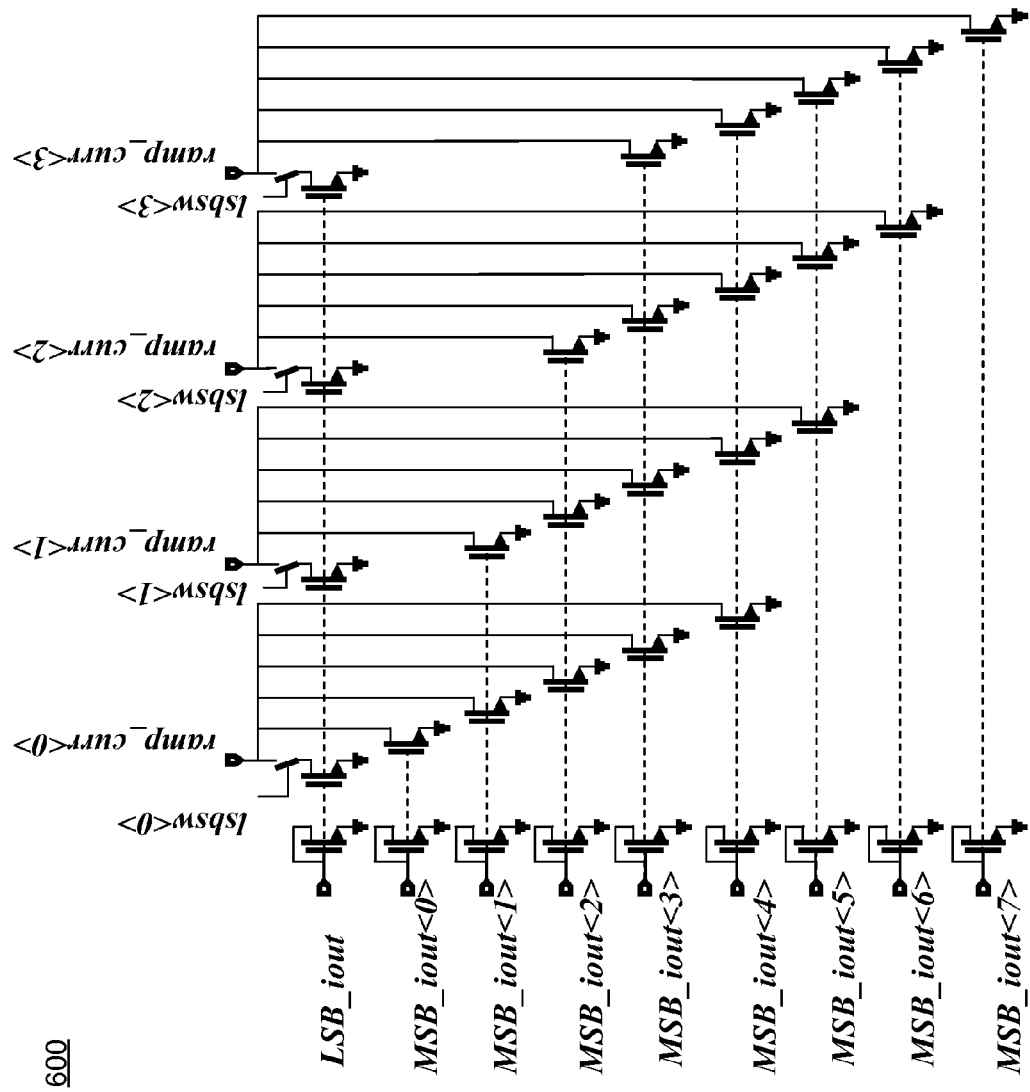
FIG. 6A illustrates an output current mirror circuit according to an exemplary embodiment of the present invention.

FIG. 6A illustrates an output current mirror circuit 600 according to an exemplary embodiment of the present invention. The output current mirror circuit 600 may generate a plurality of ramp currents (e.g., ramp_curr<3:0>) from the input currents generated based on the VGA code (e.g., one LSB_iout current and 8 MSB_iout currents). As shown in FIG. 6A, each of the ramp currents ramp_curr<3:0> may be a combination of some of the input currents. The ramp current ramp_curr<0> may be a combination of LSB_iout, MSB_iout<0>, MSB_iout<1>, MSB_iout<2>, MSB_iout<3> and MSB_iout<4>. The ramp_curr<1> may be a combination of LSB_iout, MSB_iout<1>, MSB_iout<2>, MSB_iout<3>, MSB_iout<4> and MSB_iout<5>. The ramp_curr<2> may be a combination of LSB_iout, MSB_iout<2>, MSB_iout<3>, MSB_iout<4>, MSB_iout<5> and MSB_iout<6>. The ramp_curr<3> may be a combination of LSB_iout, MSB_iout<3>, MSB_iout<4>, MSB_iout<5>, MSB_iout<6> and MSB_iout<7>. Each of the ramp currents ramp_curr<3:0> may be further controlled by one of the control signals Isbsw<3:0>, respectively.

Figure 6B:
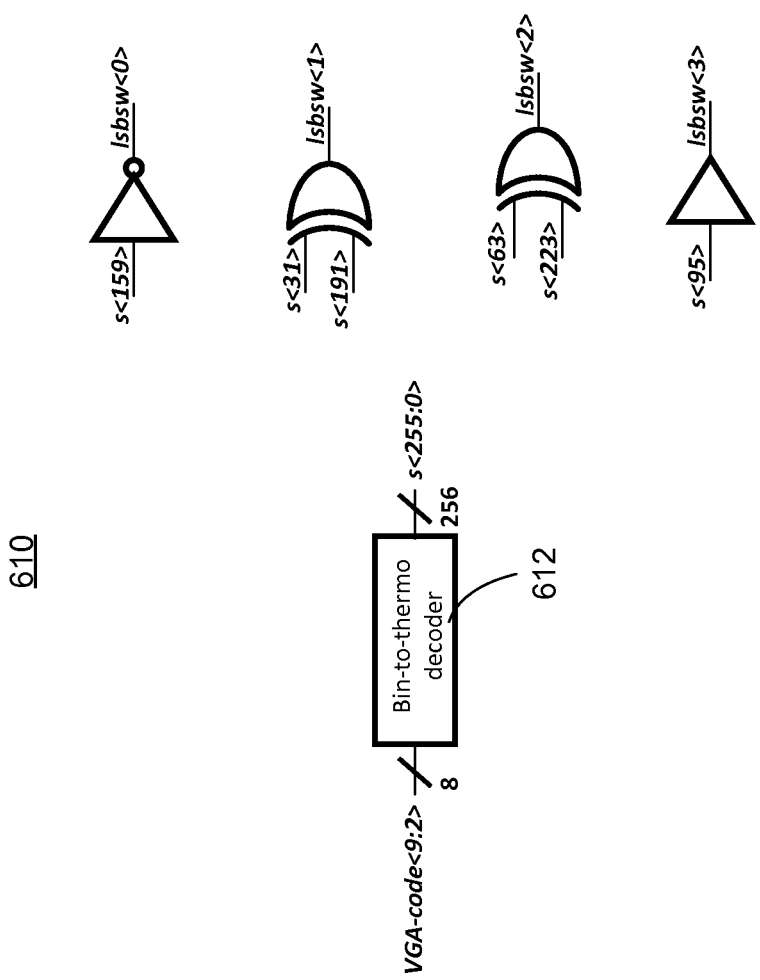
FIG. 6B illustrates a circuit generating control signals for the output current mirror circuit of FIG. 6A according to an exemplary embodiment of the present invention.

FIG. 6B illustrates a circuit 610 that may generate the control signals Isbsw<3:0> for the output current mirror circuit of FIG. 6A according to an exemplary embodiment of the present invention. The circuit 610 may comprise a bin-to-thermo decoder 612. The bin-to-thermo decoder 612 may take the eight (8) most significant bits of the VGA 10-bit control word and generates 256 signals s<255:0> (e.g., $2^8$=256). In one embodiment, as shown in FIG. 6B, the control signal Isbsw<0> may be an inversion of the signal s<159>, the control signal Isbsw<1> may be an XOR of the signals s<31> and s<191>, the control signal Isbsw<2> may be an XOR of the signals s<63> and s<223>, and the control signal Isbsw<3> may be the signal s<95>. In one embodiment, the bin-to-thermo decoder 612 may be a part of the IDAC 508.

Figure 7:
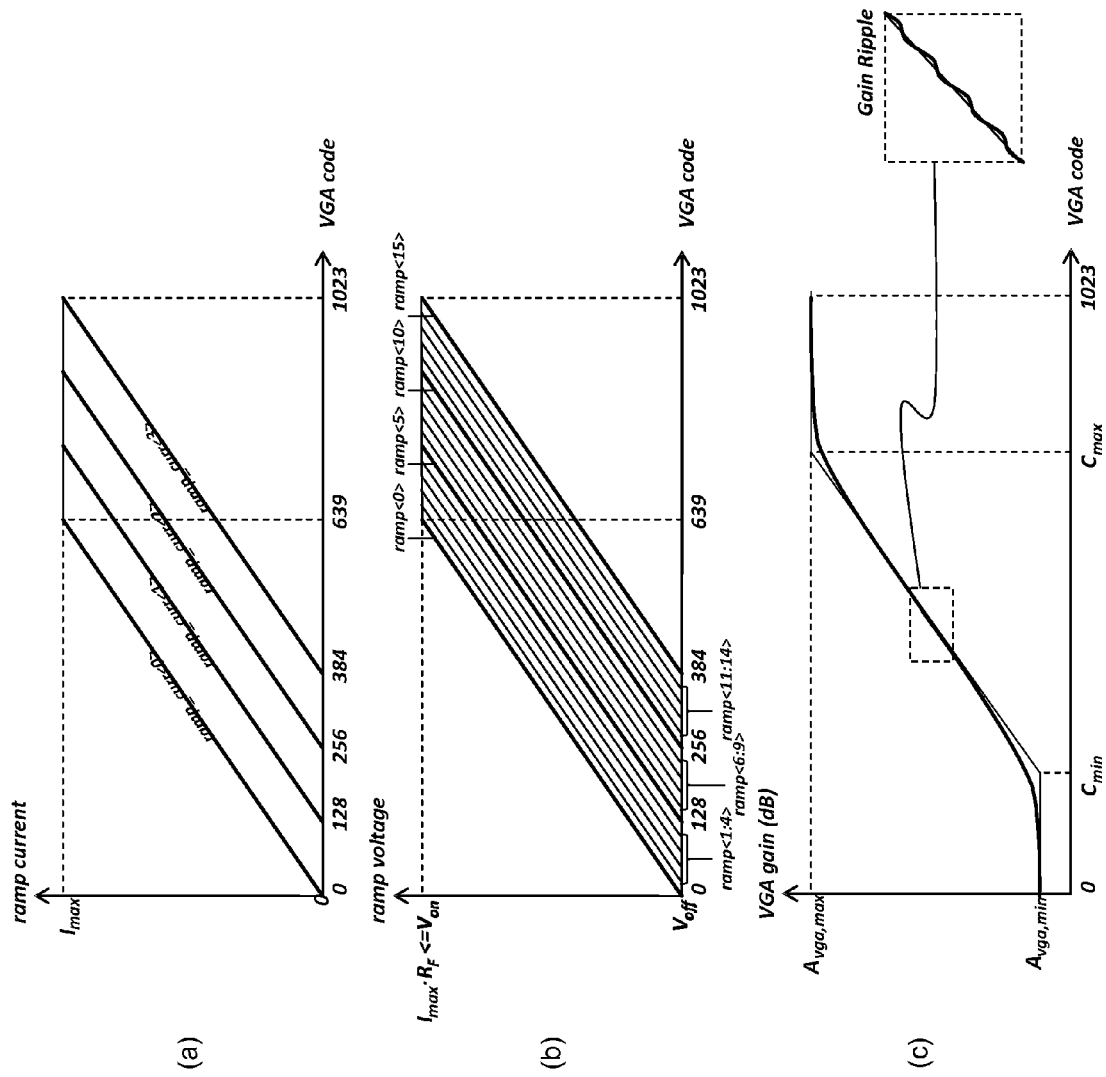
FIG. 7 illustrates ramp generator waveforms according to an exemplary embodiment of the present invention.

FIG. 7 illustrates ramp generator waveforms according to an exemplary embodiment of the present invention. As shown in FIG. 7(a), each of the ramp currents ramp_curr<3:0> may be offset by 128 VGA codes and each may span a code-range of 640 codes. Thus, each of the ramp currents may overlap with other ramp currents over certain ranges of the VGA codes. FIG. 7(b) illustrates 16 ramp voltages ramp<15:0> generated according to the ramp currents. As described above with respect to FIG. 4, the 16 ramp voltages may be applied to the switches $MNS_0$ through $MNS_{15}$ in the resistor bank R1. FIG. 7(c) illustrates the overall VGA gain corresponding the VGA code according to one embodiment. As shown in FIG. 7(c), the overall VGA gain may be a monotonic function of the VGA code. In one embodiment, the minimum VGA gain in dB may be Avga,min=20*$\log_{10}$(1+R2/R100). The maximum VGA gain may be Avga,max=20*$\log_{10}$(1+R2/R1eq), where R1eq may be the equivalent parallel resistance of R10, R11, . . . , R115 and R100 of R1 of FIG. 4. Between these minimum and maximum values, the VGA gain may increase monotonically and semi-continuous (e.g., still in steps but in much smaller steps). The magnitude of the gain ripple may depend on the value of the feedback resistors $R_F$ of the TIA's. For example, in one embodiment, the resistor RF may set the slope of the ramp voltages ramp<0>, ramp<5>, ramp<10> and ramp<15> (for example, ramp<0>=RF*ramp_curr<0>). A steeper slope may reduce the overlap of adjacent voltage ramps. In other works, the switches $MNS_0$ through $MNS_{15}$ may be turned on "harder" when $R_F$ has a small value, which may result in ripples. Overlap between ramps may help to provide a smooth gain-curve.

In one embodiment, any deviation from a linear curve may be mitigated by a gain calibration process of a gain control procedure, and by dividing the range of the VGA gain into M piece-wise linear segments. The number M may determine how small each linear segment may be. For example, M may take on a value of 20, 40 or 80. In one embodiment, the VGA gain range may be 10 dB, and, if the M is 20, 40 or 80, the VGA gain may increase or decrease in a linear segment of ½, ¼ or ⅛ dB linear segments respectively. The VGA code corresponding to each start and end linear segment may be recoded in a VGA code table "vgaTable" during a calibration process. Thus, for any specific VGA gain, the corresponding VGA code may be looked up directly from the vgaTable to determine whether it falls on a start or end of a linear segment, or may be interpolated from a start or end of a linear segment covering the specific VGA gain. It should be noted that M can take on any value desirable. A large value may mean that the VGA gain has small linear segments, while a small value may mean that the VGA gain has large linear segments.

Figure 8:
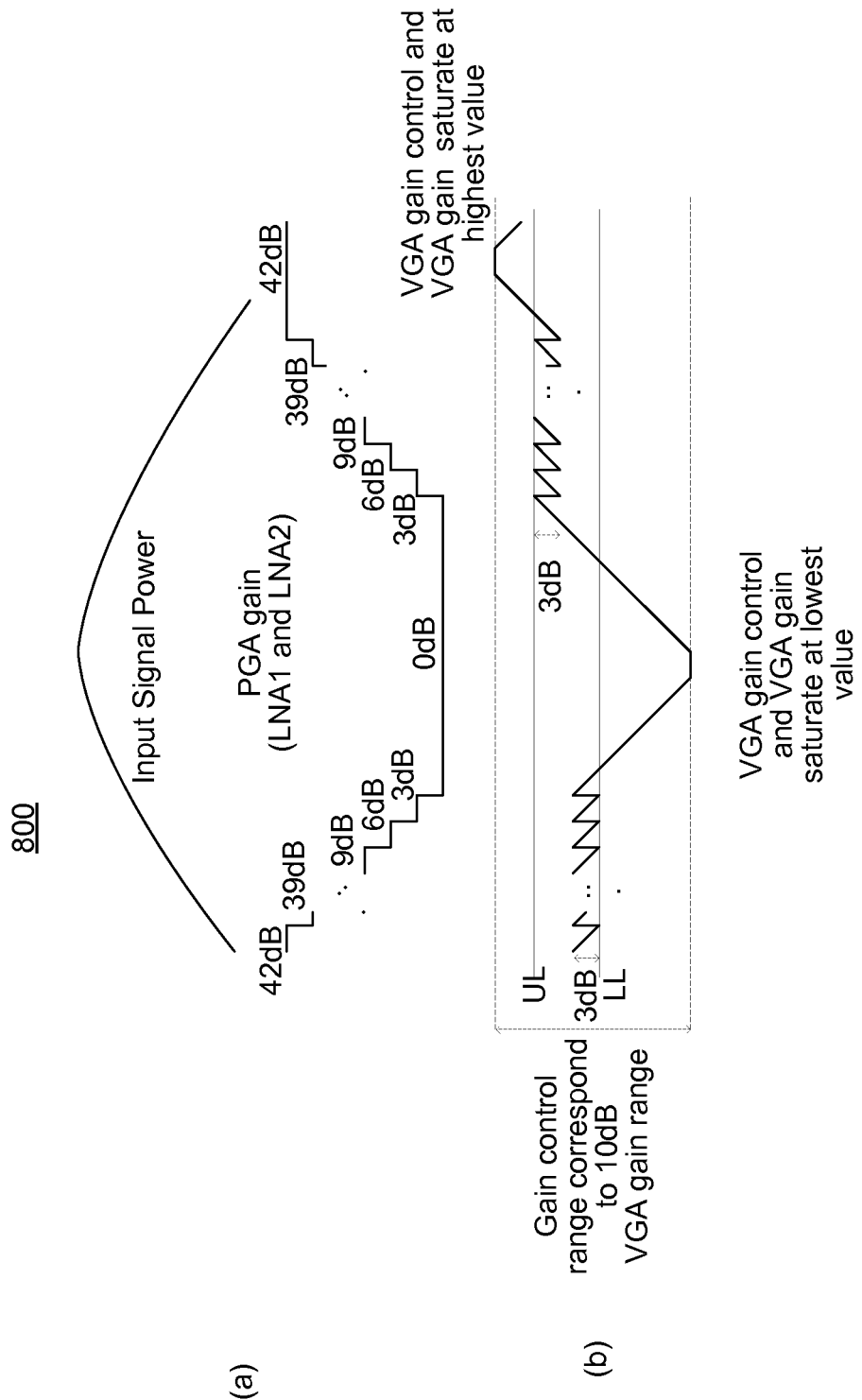
FIG. 8 illustrates gain variations of a signal processor according to an exemplary embodiment of the present invention.

FIG. 8 (including FIG. 8(a) and FIG. 8(b)) illustrates gain variations of a signal processor according to an exemplary embodiment of the present invention. As describe above with respect to FIG. 2, the AGC controller 220 may map the control signals to PGA (LNA1 or LNA2) and VGA control codes (e.g., LNA code and VGA code). FIG. 8 shows how LNA and VGA gain may be controlled. When the input signal power is close to its peak, the PGA may have a zero dB gain; and when the input signal power is lower than a certain level, the PGA gain may be started in 3 dB increments. However, as shown, a step change in PGA may occur when the VGA gain reaches one of the two preset threshold values, upper limit (UL) and lower limit (LL) thresholds. Thus, a change in the overall gain control may generally map to a change in the VGA gain control until a step change in PGA may occur.

In one embodiment, when the VGA gain goes above the UL, the PGA gain may be increased by 1 step and VGA gain control signal may be reduced such that VGA gain may drop to compensate for the increase in LNA gain. Alternatively, if the VGA gain goes below the LL, the PGA gain may be decreased by 1 step and VGA gain control signal may be increased such that VGA gain may increase to compensate for the gain drop in the PGA. In this manner, the overall gain change of the system may be continuous.

In one embodiment, the VGA gain may generally operate between the preset UL and LL limits. However, if the PGA gain saturates at maximum or minimum, the VGA gain control signal may be allowed to approach maximum or minimum gains, respectively.

In one embodiment, the AGC control code may be a L-bit word in 2's complement. The L-Bit word includes N whole bits and M fractional bits. The whole bits may map to settings for the LNAs. For example, each 8-level LNA may be controlled by 3 bits (e.g., 3-bit LNA code as shown in FIG. 3, in which corresponding to 7 steps)) and two 8-level LNAs may provide totally 14 steps and need 4 whole bits. The values of the 4 bits may be mapped into two sets of 3-bit control signal and applied to LNA1 and LNA2. As shown in FIG. 8(a), each step in the discreet step amplifier PGA (LNA1 or LNA2) may be 3 dB. If each of LNA1 and LNA2 has 7 steps, then together the PGA may provide a total gain of 42 dB. That is, 4 whole bits may be used for a total gain of 42 dB and a unit change in the AGC control code may map to a step change in the LNA gain.

The M fractional bits may correspond to a M-bit VGA code (e.g., 10-bit code as shown in FIG. 4) for a gain setting for the VGA. As shown in FIG. 8(b), the VGA may have a 10-dB gain range and with a 10-bit range the gain steps are effectively 0.01 dB/LSB, thus effectively allowing for a continuous gain change by the front-end.

FIG. 8(b) shows that VGA gain may vary between 0 and 3 dB before a step in PGA occurs. However, in general, the VGA gain may vary in a range anywhere within the 10 dB window depending on the settings of the UL and LL of the VGA thresholds. The UL and LL may be programmable parameters within the 10 dB range of the VGA. The VGA gain control setting may be kept between LL and UL as long as PGA gain is not saturated at max (42 dB) or min (0 dB) gain.

It may be difficult to assure that VGA and LNA gains occur exactly at the same time. As a result, fast switching of LNA gain may result in an impulse noise. Thus, the above gain change methodology may incorporate hysteresis into the system gain strategy to reduce the LNA gain switching transitions when a control signal is close to a switching threshold. Hysteresis may be included by the difference between the UL and LL thresholds, and by increasing UL and LL the hysteresis may exceed a LNA gain step. As such, hysteresis does not have to be an integral of a LNA gain step.

In one embodiment, the LNA2 gain may start to increase/decrease first as the input signal power decreases/increases. For example, when the input signal power is decreasing, the LNA2 gain may be the first LNA to decrease till it reaches its minimum. Then, LNA1 gain may start to reduce its gain until its gain drops to its minimum value.

Figure 9:
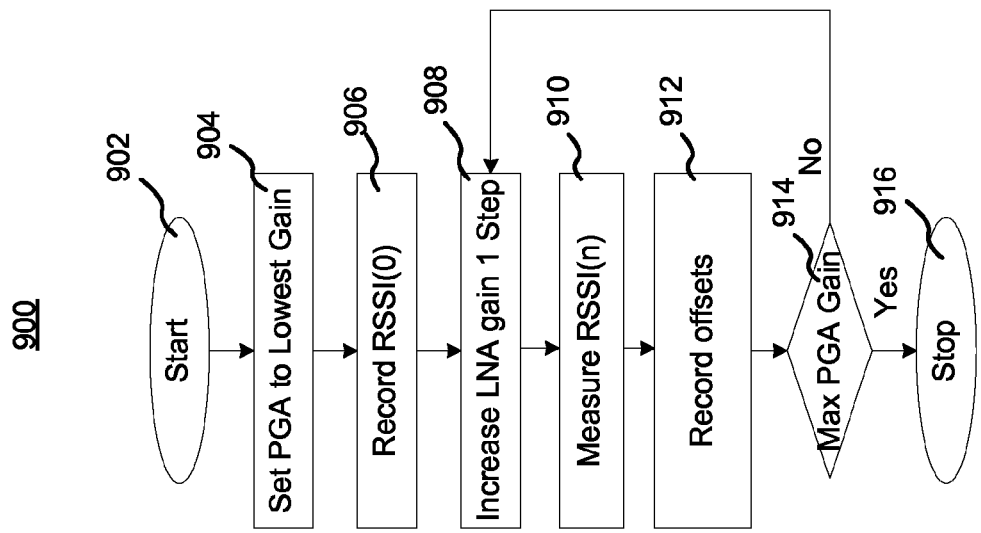
FIG. 9 illustrates a process for a PGA gain calibration procedure according to an exemplary embodiment.

As described above, due to non-idealities, the PGA (e.g., LNA1 and LNA2) gain steps may deviate from the nominal step values (e.g., 2.9 dB or 3.1 dB instead of 3 dB). Further, as shown in FIG. 7(c), the VGA gain vs. gain control signal variation (e.g., VGA code) may not be linear and can also vary from part to part. Thus, in one or more embodiments, calibration may be performed. FIG. 9 illustrates a process 900 for a PGA gain calibration procedure according to an exemplary embodiment. The process 900 may start at block 902. At block 904, the PGA may be set to the lowest gain (e.g., 0 dB). At block 906, the received signal strength indicator RSSI(0) may be measured at the lowest gain setting. At block 908, the PGA gain setting may be adjusted to increase one step (e.g., LNA1 or LNA 2 increase one step of 3 dB). At block 910, the RSSI(n) corresponding to the current step n may be measured. At block 912, the offset for the current step n may be recorded. For example, the offset with respect to the lowest gain may be calculated by an equation of $[10*\log_{10}(RSSI(n)/RSSI(0))-n*3]/3$. At block 914, the process 900 may determine whether it has reached the maximum PGA gain. If yes, the process 900 may proceed to block 916 and stop. If no, the process 900 may go back to block 908 to increase another step for the discreet step gain.

In one embodiment, the PGA gain calibration may use 15 registers (16 bit word each) to store the LNA gain offsets and compensations values for the LNA1 and LNA2 gains steps. These 15 registers may correspond to the storage of the LNA Gain Corrections 224 shown in FIG. 2.

Figure 10:
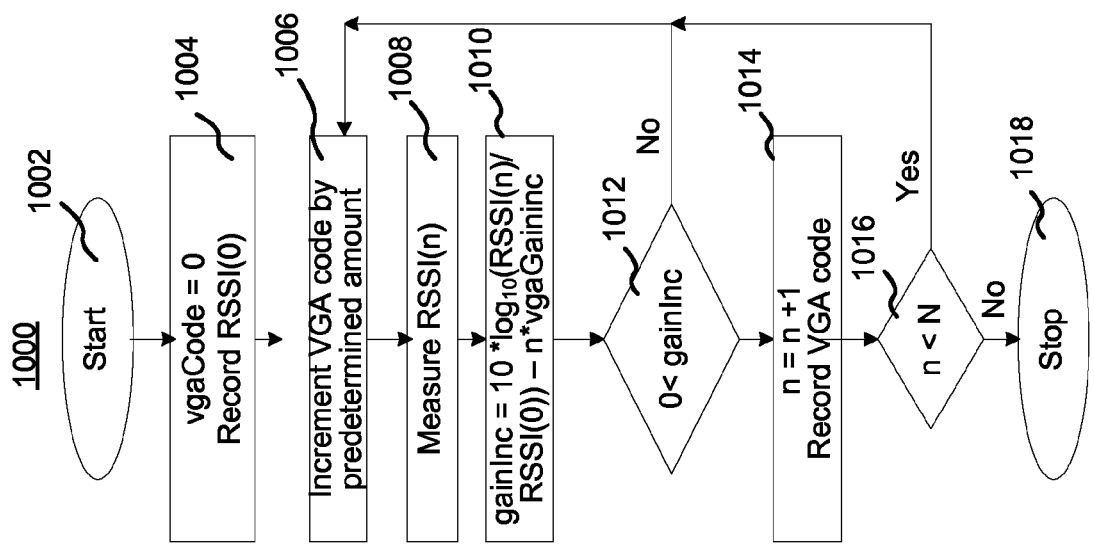
FIG. 10 illustrates a process for mapping the LNA offsets to VGA control offsets according to an exemplary embodiment of the present invention.

The LNA switching point may occur when the VGA gain reaches UL or LL depending on the direction of signal strength variation. At each transition point (e.g., increase or decrease a LNA step), a new offset word may be recalled from storage and applied to the VGA at the same time as the LNA1 or LNA2 gain changes so a smooth transition may be provided during LNA gain switch. FIG. 10 illustrates a process 1000 for mapping the LNA offsets to VGA control offsets according to an exemplary embodiment of the present invention. The process 1000 may start at block 1002. At block 1004, the VGA code may be set as zero and the initial signal strength RSSI(0) at step 0 may be measured and recorded. At block 1006, the VGA code may be incremented by a predetermined amount, for example, the amount may be determined based on how much accuracy is desired in calibration, and in what region of the VGA gain curve the increase lies. At block 1008, the signal strength RSSI(n) at the current step n may be measured. At block 1010, the value of the increased gain may be determined by the equation of $gainInc=10*\log_{10}(RSSI(n)/RSSI(0))-n*vgaGaininc$, in which the vgaGaininc may be the resolution for the linearization process (e.g., the linearization process may occur in ¼, ½, or 1 dB increments). At block 1012, the process 1000 may determine whether the gainInc is greater than zero. If no, the process 1000 may return to the block 1006 to increment VGA code by the predetermined amount and repeat the blocks 1008, 1010 and 1012 again. If yes, the process 1000 may determine whether the gainInc is greater than zero. If no, the process 1000 may proceed to the block 1014 to increment the step from n to n+1 and record the VGA code. Then at the block 1016, the process 1000 may determine whether the step number n is still less than a maximum number N. If yes, the process 1000 may proceed to block 1018 and stop. If no, the process 1000 may proceed to block 1006 and the repeat the blocks thereafter.

Accordingly, at each step of the LNA1 and LNA2 gain change, the correct VGA gain control signal offset may be determined. The correct VGA control signal may correspond to the VGA gain that accurately compensates the corresponding discrete gain step so the overall gain may stay constant.

Figure 11:
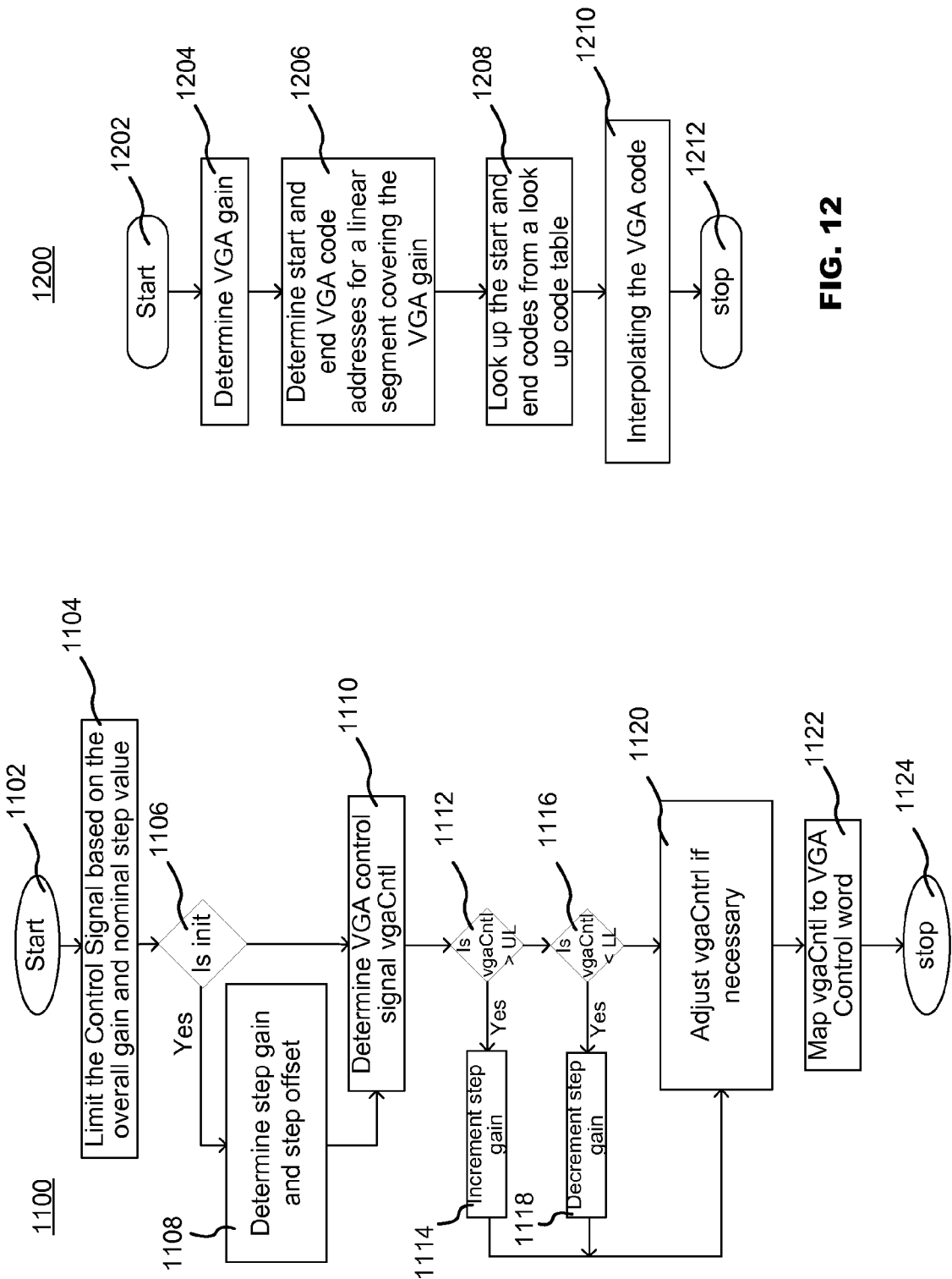
FIG. 11 illustrates a process for generating gain distributions among the PGA and VGA according to an exemplary embodiment of the present invention.

FIG. 11 illustrate a process 1100 for generating gain distributions among the PGA and VGA according to an exemplary embodiment of the present invention. The process 1100 may allow corrections for the LNA gain variation using a one-to-one mapping between the control signal and the AGC gain setting. The process 1100 may start at block 1102 and proceed to block 1104. At block 1104, the control signal "cntlSig" may be limited based on the overall gain and nominal step value. For example, if the PGA (e.g., LNA1 and LNA2) has a total gain of 42 dB, the VGA has a gain range of 10 dB and the step has a nominal value of 3 dB, the control signal may be limited to between 0 and 52/3. At block 1106, the process 1100 may determine whether this is an initialization process. If yes, the process 1100 may proceed to block 1108, at which the step gain "InaGains" and an offset "InaOffset" associated with the step gain may be determined. For example, the initial InaGains may be determined by the control signal subtracting the initial VGA control signal. In one embodiment, the InaGains may be limited to an integer number between 0 and 14, the LNA1 code may be set as the lesser value between 7 and InaGains (e.g., MIN(7, Ina-Gains)), the LNA2 code may be set as larger value between 0 and InaGains-7 (e.g., MAX(0, InaGains-7)). The InaOffset may be looked up from the storage that stores the result of a PGA calibration.

In one embodiment, the control signal may take priority and the initial VGA control signal may be over-written. The VGA control signal may determine the overall gain setting, and its value may determine the PGA and VGA gains based upon the UL and LL thresholds. Therefore, even if an VGA INIT gain is requested, it may be overwritten by the process that determines the PGA and VGA gain settings.

If the check returns no at block 1106, and also from block 1108, the process 1100 may proceed to block 1110. At block 1110, the VGA control signal "vgaCntl" may be determined. In one embodiment, the vgaCntl may be determined by the equation of vgaCntl=cntlSig−InaOffset−InaGains, and may be limited in a range of 0 to 10/3. At block 1112, vgaCntl may be compared to the upper threshold UL. If vgaCntl>UL, the process 1100 may proceed to block 1114, at which InaGains may be incremented by 1; if not, the process 1100 may proceed from the block 1112 to block 1116 to compare the vgaCntl to the lower threshold LL. If vgaCntl<UL, the process 1100 may proceed to block 1118, at which InaGains may be decremented by 1. From blocks 1114 and 1118, and if comparison at the block 1116 is false, the process 1100 may proceed to block 1120.

At block 1120, the vgaCntl may be adjusted if necessary. In general, the VGA control may be limited to between 0 and 10/3 and to be adjusted to account for the step gain in LNAs. In one embodiment, the VGA control may not be adjusted when the LNA gains are max or min. That is, when even if vgaCntl exceeds UL or drops below LL, the LNA gain would not change. If InaGains is changed (e.g., incremented or decremented), the InaOffset and LNA codes may need to be updated. In one embodiment, as describe above, at a calibration process, the gain differential between the cumulative gains of the LNAs relative to their nominal values may be measured, and may be converted to VGA control signal offset. These values may be stored in a lookup table for the different LNA combinations. The location adhering to 0 dB of LNA gain may be zero. In normal operation mode, the VGA control signal may be modified by the stored offsets for the selected LNA gain resulting in a continuous operation of the AGC at the presence of a PGA gain change. At block 1122, the process 1100 may map the vgaCntl to an VGA control code. A block 1124, the process 1100 may stop.

Figure 12:
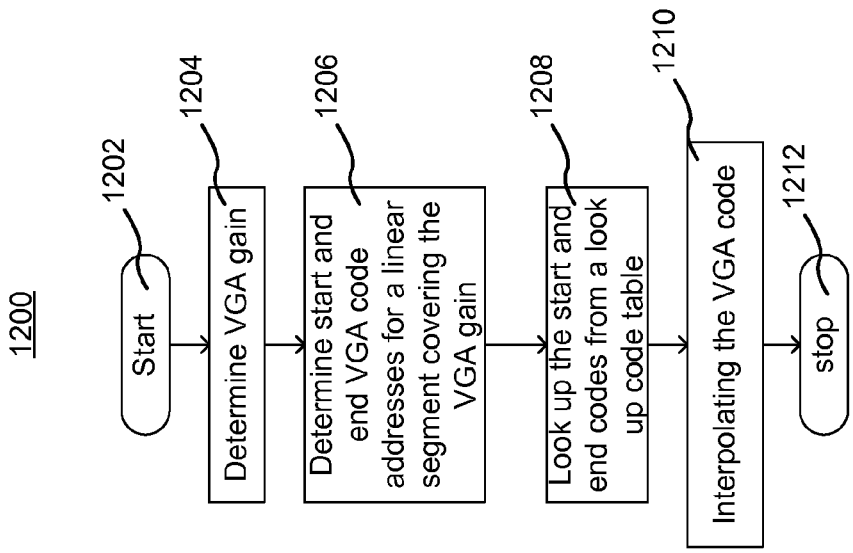
FIG. 12 illustrates a process for determining the VGA codes as a function of VGA control signal according to an exemplary embodiment of the present invention.

The VGA gain/control signal variation vs. VGA control code can have any shape as long as it is monotonic as shown in FIG. 7(c). As described with respect to FIG. 7(c), this may allow for a construction of a piece-wise linear model of the VGA gain versus the VGA control code (e.g., 10-bit word). FIG. 12 illustrates a process 1200 for determining the VGA codes as a function of VGA control signal according to an exemplary embodiment of the present invention. The process 1200 may start at block 1202. At block 1204, the process 1200 may determine the determine VGA gain "vgaGain". The VGA gain may be determined based on the VGA control signal vgaCntl (e.g., according to the process 1100). In one embodiment, the vgaGain may be determined by multiplying the vgaCntl by the nominal value of the step gain of PGA. For example, for a 10 dB span of the VGA gain, the VGA control signal values may be between 0 and 10/3 corresponding to the minimum and the maximum VGA gain control signal values, respectively. Thus, the vgaGain may be obtained by vgaCntl times three.

At block 1206, the process 1200 may determine start and end VGA code addresses for a linear segment covering the VGA gain. As described above with respect to FIG. 7, the VGA gain may be implemented in a piece-wise linear model. The piece-wise linear model of the VGA gain may be developed by incrementing the gain at measuring the VGA code at predetermined VGA increments. For instance, for a ½ dB gain increments, a 21 entry look up table for the 10 dB VGA range may be needed. Thus, based on vgaGain, a segment covering the vgaGain may be determined and the start and end VGA codes of a corresponding segment may be obtained. In one embodiment, the start code address may be determined by vgaCodeAdd=vgaGain*gain2Add and the end code address may be determined by nextCodeAdd=vgaCodeAdd+1. The gain2Add may be reciprocal of the gain increment setting. In one embodiment, the table may be in either one of ⅛, ¼, ½, or 1 dB increments. Hence, the piecewise address of VGA gain table may be determined from product of the VGA gain and the gain2Add. For example, if the VGA gain is 4.3 dB, the VGA code for the VGA gain may be a value between the $9^{th}$ and $10^{th}$ address in ½ db increments (assuming the first address is for 0 dB).

At block 1208, the start and end VGA codes of the corresponding segment covering the vgaGain may be looked up from a lookup table vgaTable. For example, startCode=vgaTable[vgaCodeAdd] and endCode=vgaTable[nextCodeAdd]. Next, at block 1210, the vgaCode corresponding to the gain value may be linearly interpolated by utilizing the piece-wise linear model of the VGA gain. For example, the fraction of the VGA gain within the segment may be determined by fracVgaGain=vgaGain−vgaCodeAdd*gainInc. gainInc may represent the steps of the piece-wise linear model (e.g., ½, ¼, or ⅛ of a dB when M may be 20, 40 and 80 for a span of 10 dB). The VGA code may be interpolated by vgaCode=startCode+(endCode−startCode)*fracVgaGain. In one embodiment, the piece-wise linear model of the VGA may allow for an accurate correction of LNA step change.

Several embodiments of the present invention are specifically illustrated and described herein. However, it will be appreciated that modifications and variations of the present invention are covered by the above teachings and within the purview of the appended claims without departing from the spirit and intended scope of the invention.

It should be understood that there exist implementations of other variations and modifications of the invention and its various aspects, as may be readily apparent to those of ordinary skill in the art, and that the invention is not limited by specific embodiments described herein. Features and embodiments described above may be combined. It is therefore contemplated to cover any and all modifications, variations, combinations or equivalents that fall within the scope of the basic underlying principals disclosed and claimed herein.

We claim:
1. A signal processing circuit, comprising:
 at least one low noise amplifier (LNA) for generating a discrete step gain;
 a variable gain amplifier (VGA) for generating a continuously adjustable gain within a lower limit threshold and an upper limit threshold; and
 an automatic gain control (AGC) unit including an AGC controller configured to:
  compare a digital signal to a power threshold and adjust a control signal for controlling respective gains of the LNA and the VGA, map the control signal to a LNA control code for controlling the gain of the LNA and a VGA control code for controlling the gain of the VGA, and cause a discrete step change in the gain of the LNA if the gain of the VGA reaches one of the lower limit and upper limit thresholds;

wherein the VGA control code compensates for errors in a step size of the discrete step gain of the at least one LNA.

2. The signal processing circuit of claim 1, wherein the AGC controller maps the discrete step gain for each LNA of the at least one LNA.

3. The signal processing circuit of claim 1, wherein the AGC unit further comprises a storage having stored thereon:

VGA codes for a plurality of measured VGA gains;

gain step offsets for each discrete step of the at least one LNA, the gain step offsets indicating the errors in the step size; and the lower limit and upper limit thresholds.

4. The signal processing circuit of claim 1, wherein all changes in the LNAs occur in one respective LNA before the respective LNA reaches a limit of the respective LNA.

5. The signal processing circuit of claim 1, wherein an overall front end gain is determined based on a root mean square (RMS) power of the digital signal.

6. The signal processing circuit of claim 1, wherein the AGC unit includes one or more filters that performs post processing on control decisions to smooth out decision outputs and to control an adaptation rate.

7. The signal processing circuit of claim 1, wherein the VGA gain is reduced after the step change in the LNA occurs.

8. The signal processing circuit of claim 1, wherein the continuously-adjustable gain generated by the VGA supplements the discrete step gain generated by the at least one LNA such that the signal processing circuit produces a front end gain that includes stepwise gains and continuous gain between the stepwise gains.

9. The signal processing circuit of claim 1, wherein responsive to a determination that the gain of the VGA exceeds the upper limit threshold, the at least one LNA gain is increased by one step and the VGA gain is reduced to compensate for the increase in the gain of the at least one LNA.

10. The signal processing circuit of claim 1, wherein responsive to a determination that the gain of the VGA is below the lower limit threshold, the at least one LNA gain is decreased by one step and the VGA gain is increased to compensate for the decrease in the gain of the at least one LNA.

11. A method to control a front end gain of a signal processor, the front end gain including a discrete step gain from at least one low noise amplifier (LNA) and a continuously adjustable gain, within a lower limit threshold and an upper limit threshold, from a variable gain amplifier (VGA), the method comprising:

comparing, by a controller, an output of the signal processor to a power threshold to generate a control signal for controlling respective gains of the LNA and the VGA;

mapping, by the controller, the control signal to a LNA control code for controlling the gain of the LNA and a VGA control code for controlling the gain of the VGA; and causing, by the controller, a discrete step change in the gain of the LNA if the gain of the VGA reaches one of the lower limit and upper limit threshold;

wherein the VGA control code compensates for errors in a step size of the discrete step pain of the at least one LNA.

12. The method of claim 11, wherein each gain step of the LNA deviates from a nominal value by an offset and all offsets are recorded during a calibration process.

13. The method of claim 12, further comprising looking up an offset for a gain step and compensating for the offset.

14. The method of claim 11, wherein the VGA gain is a monotonic curve with respect to the VGA control code.

15. The method of claim 11, wherein the VGA gain is changed to compensate the step change to effect a smooth gain change by applying an offset to the VGA gain at substantially the same time as causing the discrete step change in the gain of the at least one LNA.

16. The method of claim 15, wherein all step changes in the LNAs occur in one respective at least one LNA before the respective LNA reaches a limit of the at least one LNA.

17. The method of claim 11, wherein an overall front end gain is determined based on a root mean square (RMS) power of the output of the signal processor.

18. The method of claim 11, further comprising filtering a control decision to smooth out a decision output and to control an adaptation rate.

19. The method of claim 11, wherein the VGA gain is reduced after the discrete step gain changes.

20. A signal processing circuit, comprising:

means for generating a discrete step gain;

means for generating a continuously adjustable gain within a lower limit threshold and an upper limit threshold;

means for comparing an output of the signal processor to a power threshold to generate a control signal;

means for mapping the control signal to a LNA control code for controlling the gain of the LNA and a VGA control code for controlling the gain of the VGA; and means for causing a discrete step change in the gain of the LNA if the gain of the VGA reaches one of the lower limit and upper limit threshold;

wherein the VGA control code compensates for errors in a step size of the discrete step coin of the at least one LNA.

21. The signal processing circuit of claim 20, wherein the VGA gain is reduced after the discrete step gain changes.

* * * * *

UNITED STATES PATENT AND TRADEMARK OFFICE
CERTIFICATE OF CORRECTION

| | | |
|---|---|---|
| PATENT NO. | : 8,965,317 B2 | Page 1 of 1 |
| APPLICATION NO. | : 13/094485 | |
| DATED | : February 24, 2015 | |
| INVENTOR(S) | : Reza Alavi et al. | |

It is certified that error appears in the above-identified patent and that said Letters Patent is hereby corrected as shown below:

In the claims,

In Claim 20, Column 12, line 51, please change:

"step coin of the" to --step gain of the--.

Signed and Sealed this
Twenty-seventh Day of October, 2015

Michelle K. Lee
*Director of the United States Patent and Trademark Office*